(12) United States Patent
Tang

(10) Patent No.: US 12,014,658 B2
(45) Date of Patent: Jun. 18, 2024

(54) LED SPLICING DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Aihua Tang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 958 days.

(21) Appl. No.: 16/962,054

(22) PCT Filed: May 18, 2020

(86) PCT No.: PCT/CN2020/090902
§ 371 (c)(1),
(2) Date: Jul. 14, 2020

(87) PCT Pub. No.: WO2021/212583
PCT Pub. Date: Oct. 28, 2021

(65) Prior Publication Data
US 2021/0335155 A1   Oct. 28, 2021

(30) Foreign Application Priority Data
Apr. 24, 2020   (CN) .......................... 202010333332.7

(51) Int. Cl.
G09F 9/302   (2006.01)
G09F 9/33   (2006.01)
(Continued)

(52) U.S. Cl.
CPC .............. *G09F 9/3026* (2013.01); *G09F 9/33* (2013.01); *H01L 27/156* (2013.01); *H01L 33/62* (2013.01)

(58) Field of Classification Search
CPC ....... G09F 9/3026; G09F 9/33; H01L 27/156; H01L 33/62
See application file for complete search history.

(56) References Cited

U.S. PATENT DOCUMENTS

| 9,447,799 B2 | 9/2016 | Kludt et al. |
| 2009/0289160 A1* | 11/2009 | Kludt ........................ G09F 9/33 248/226.11 |

(Continued)

FOREIGN PATENT DOCUMENTS

| CN | 102136228 A | 7/2011 |
| CN | 103969864 A | 8/2014 |

(Continued)

*Primary Examiner* — Ratisha Mehta
(74) *Attorney, Agent, or Firm* — PV IP PC; Wei Te Chung; Zhigang Ma

(57) ABSTRACT

An LED splicing display panel includes at least one repeat unit. Each of the repeat unit includes four sub-LED display panels spliced to each other. Each of the sub-LED display panels includes a display region and fan-out regions. A plurality of slits are between two adjacent sub-LED display panels. The two adjacent sub-LED display panels share the plurality of fan-out regions. The plurality of sub-pixels in the four display regions include a plurality of irregular-shaped sub-pixels and a plurality of regular-shaped sub-pixels. Each of the plurality of irregular-shaped sub-pixels abuts to the corresponding fan-out region.

20 Claims, 3 Drawing Sheets

(51) Int. Cl.
*H01L 27/15* (2006.01)
*H01L 33/62* (2010.01)

(56) References Cited

U.S. PATENT DOCUMENTS

| | | |
|---|---|---|
| 2014/0218956 A1 | 8/2014 | Wu |
| 2019/0131381 A1 | 5/2019 | Tang |
| 2020/0381586 A1* | 12/2020 | Yu .......................... H01L 33/20 |

FOREIGN PATENT DOCUMENTS

| | | |
|---|---|---|
| CN | 206115896 U | 4/2017 |
| CN | 107742480 A | 2/2018 |
| CN | 108777114 A | 11/2018 |
| CN | 108898959 A | 11/2018 |
| CN | 109410773 A | 3/2019 |
| CN | 110379314 A | 10/2019 |
| CN | 110910777 A | 3/2020 |

* cited by examiner

LED SPLICING DISPLAY PANEL

FIELD OF INVENTION

The present disclosure relates to the field of display technology, and particularly relates to a light emitting diode (LED) splicing display panel.

BACKGROUND OF INVENTION

Currently, light emitting diode (LED) display screens are a type of flat-panel displays, and they are constituted by a plurality of small LED module panels and used as equipment for displaying various information such as words, images, video signals, etc. High brightness, wider viewing angles, and good color recovering ability of the LED display screens are also better than liquid crystal display (LCD) screens. Having great advertising values, LED screen swiping machines are often used in airports, shopping malls, hotels, high-speed rails, subways, cinemas, exhibitions, office buildings, etc. for targeting consumers with great spending power. The current LED display screens need to be spliced to manufacture LED splicing screens during use according to specific lengths. However, the LED splicing screens are developing toward a direction of smaller dimensions and higher resolution. This challenges dimensional compression of an LED chip in a single pixel space, thin film transistors, and designs of related wirings. Particularly, difficulty of pixel designs is substantially increased in order to achieve seamless splicing, and this greatly affects development of the LED splicing screens toward the direction of small dimensions and high resolution.

In summary, part of pixels are limited in space in key positions in order to achieve seamless splicing in current LED splicing display panels, and this greatly affects development of the LED splicing display panels toward the direction of small dimensions and high resolution.

A technical problem of the present disclosure is that part of the pixels are limited in space in key positions in order to achieve seamless splicing in current LED splicing display panels, and this greatly affects development of the LED splicing screens toward the direction of small dimensions and high resolution.

SUMMARY OF INVENTION

A light emitting diode (LED) splicing display panel is provided by embodiments of the present disclosure, which can ease the problem of part of pixels being limited in space in key positions so as to solve the technical problem that part of pixels are limited in spaces in key positions in order to achieve seamless splicing in current LED splicing display panels, greatly affecting development of the LED splicing screens toward the directions of small dimensions and high resolution.

An embodiment of the present disclosure provides an LED splicing display panel. The LED splicing display panel includes at least one repeat unit. Each of the repeat unit includes four sub-LED display panels spliced to each other. A plurality of display regions of the four sub-LED display panels are arranged in two rows and two columns. Each of the sub-LED display panels includes a display region and a plurality of fan-out regions respectively corresponding to two adjacent sides disposed on the plurality of display regions. A plurality of slits are between two adjacent sub-LED display panels. The two adjacent sub-LED display panels share the plurality of fan-out regions.

Furthermore, a plurality of sub-pixels are in four display regions. The plurality of sub-pixels include a plurality of irregular-shaped sub-pixels located on edges of the four display regions, and a plurality of regular-shaped sub-pixels respectively adjacent to the plurality of irregular-shaped sub-pixels. Each of the plurality of irregular-shaped sub-pixels abuts to the corresponding fan-out region. A display area of the plurality of irregular-shaped sub-pixels is less than a display area of the regular-shaped sub-pixels.

In the LED splicing display panel provided by an embodiment of the present disclosure, the plurality of fan-out regions include a first fan-out region arranged along a first direction D1 and a second fan-out region arranged along a second direction D2. The plurality of slits include a first slit arranged along the first direction D1 and a second slit arranged along the second direction D2. The first direction D1 is perpendicular to the second direction D2.

In the LED splicing display panel provided by an embodiment of the present disclosure, a plurality of data signal lines are disposed in the first fan-out region, and a plurality of scanning signal lines are disposed in the second fan-out region.

In the LED splicing display panel provided by an embodiment of the present disclosure, the plurality of sub-pixels abutting the plurality of fan-out regions are the plurality of irregular-shaped sub-pixels.

In the LED splicing display panel provided by an embodiment of the present disclosure, the plurality of data signal lines are arranged on a same side of the first slit, and the plurality of scanning signal lines are arranged on a same side of the second slit.

In the LED splicing display panel provided by an embodiment of the present disclosure, the plurality of data signal lines are arranged on a same side of the first slit, and the plurality of scanning signal lines are arranged on adjacent two sides of the second slit.

In the LED splicing display panel provided by an embodiment of the present disclosure, the plurality of irregular-shaped sub-pixels include a plurality of first irregular-shaped sub-pixels and a plurality of second irregular-shaped sub-pixels. The plurality of first irregular-shaped sub-pixels respectively abut to the first fan-out region and the second fan-out region, and the plurality of second irregular-shaped sub-pixels abut to the first fan-out region or the second fan-out region.

In the LED splicing display panel provided by an embodiment of the present disclosure, part of the plurality of sub-pixels abut to the plurality of fan-out regions are the plurality of irregular-shaped sub-pixels.

In the LED splicing display panel provided by an embodiment of the present disclosure, the plurality of data signal lines are arranged on two adjacent sides of the first slit in a staggered manner, and the plurality of scanning signal lines are arranged on two adjacent sides of the second slit in a staggered manner.

An embodiment of the present disclosure further provides an LED splicing display panel. The LED splicing display panel includes at least one repeat unit. Each of the repeat unit includes four sub-LED display panels spliced to each other. A plurality of display regions of the four sub-LED display panels are arranged in two rows and two columns. Each of the sub-LED display panels includes a display region and a plurality of fan-out regions respectively corresponding to two adjacent sides disposed on the plurality of display region. A plurality of slits are between two adjacent sub-LED display panels. Two adjacent sub-LED display panels share the plurality of fan-out regions.

Furthermore, a plurality of sub-pixels are in the four display regions. The plurality of sub-pixels include a plurality of irregular-shaped sub-pixels located on edges of the four display regions, and a plurality of regular-shaped sub-pixels respectively adjacent to the plurality of irregular-shaped sub-pixels. Each of the plurality of irregular-shaped sub-pixels abuts to the corresponding fan-out region. Furthermore, a plurality of sub-pixels are in the four display regions. The plurality of sub-pixels include a plurality of irregular-shaped sub-pixels located on edges of the four display regions, and a plurality of regular-shaped sub-pixels respectively adjacent to the plurality of irregular-shaped sub-pixels. Each of the plurality of irregular-shaped sub-pixels abuts to the corresponding fan-out region.

In the LED splicing display panel provided by an embodiment of the present disclosure, the plurality of fan-out regions include a first fan-out region arranged along a first direction D1 and a second fan-out region arranged along a second direction D2. The plurality of slits include a first slit arranged along the first direction D1 and a second slit arranged along the second direction D2. The first direction D1 is perpendicular to the second direction D2.

In the LED splicing display panel provided by an embodiment of the present disclosure, a plurality of data signal lines are disposed in the first fan-out region, and a plurality of scanning signal lines are disposed in the second fan-out region.

In the LED splicing display panel provided by an embodiment of the present disclosure, the plurality of sub-pixels abutting the plurality of fan-out regions are the plurality of irregular-shaped sub-pixels.

In the LED splicing display panel provided by an embodiment of the present disclosure, the plurality of data signal lines are arranged on a same side of the first slit, and the plurality of scanning signal lines are arranged on a same side of the second slit.

In the LED splicing display panel provided by an embodiment of the present disclosure, the plurality of data signal lines are arranged on a same side of the first slit, and the plurality of scanning signal lines are arranged on adjacent two sides of the second slit.

In the LED splicing display panel provided by an embodiment of the present disclosure, the plurality of irregular-shaped sub-pixels include a plurality of first irregular-shaped sub-pixels and a plurality of second irregular-shaped sub-pixels. The plurality of first irregular-shaped sub-pixels respectively abut to the first fan-out region and the second fan-out region, and the plurality of second irregular-shaped sub-pixels abut to the first fan-out region or the second fan-out region.

In the LED splicing display panel provided by an embodiment of the present disclosure, part of the plurality of sub-pixels abut to the plurality of fan-out regions are the plurality of irregular-shaped sub-pixels.

In the LED splicing display panel provided by an embodiment of the present disclosure, the plurality of data signal lines are arranged on two adjacent sides of the first slit in a staggered manner, and the plurality of scanning signal lines are arranged on two adjacent sides of the second slit in a staggered manner.

Compared to the prior art, the LED splicing display panel provided by the embodiments of the present disclosure effectively eases spatial limitation of part of pixels in key positions by disposing the irregular-shaped sub-pixels and abutting them to the corresponding fan-out regions on the edges of the four display regions in one repeat unit, which is further conducive to development of the LED splicing screens toward the direction of small dimensions and high resolution.

DETAILED DESCRIPTION OF PREFERRED EMBODIMENTS

Embodiments of the present disclosure target to a technical problem of current light emitting diode (LED) splicing display panels, that is, part of pixels are limited in space in key positions in order to achieve seamless splicing, greatly affecting development of the LED splicing screens toward the direction of small dimensions and high resolution. The embodiments can solve the defect.

Figure 1:
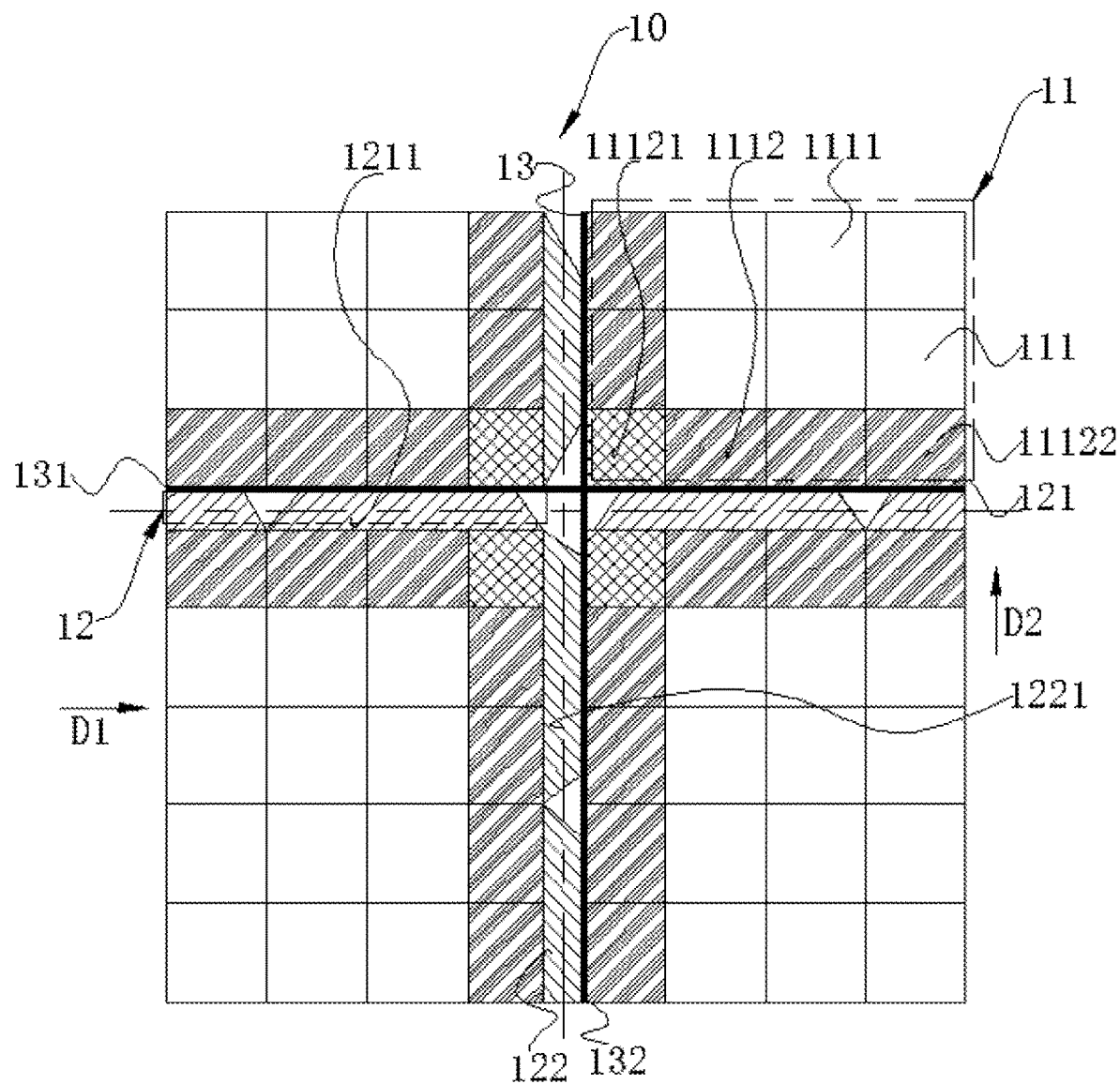
FIG. 1 is a structural schematic diagram of repeat units of an LED splicing display panel provided by a first embodiment of the present disclosure.

Illustrated in FIG. 1 is a structural schematic diagram of repeat units of an LED splicing display panel provided by a first embodiment of the present disclosure. Furthermore, the LED splicing display panel includes at least one repeat unit 10. Each of the repeat units 10 includes four sub-LED display panels spliced to each other. Display regions 11 of the four sub-LED display panels are arranged in two rows and two columns. Each of the sub-LED display panels includes the display region 11 and fan-out regions 12 respectively corresponding to two adjacent sides of the plurality of display regions 11. Slits 13 are between two adjacent sub-LED display panels. The two adjacent sub-LED display panels share the fan-out regions 12.

Specifically, sub-pixels 111 are in the four display regions 11. The sub-pixels 111 include irregular-shaped sub-pixels 1112 located on edges of the four display regions 11, and regular-shaped sub-pixels 1111 respectively adjacent to the irregular-shaped sub-pixels 1112. Each of the irregular-shaped sub-pixels 1112 abuts to the corresponding fan-out region 12.

Specifically, a display area of the irregular-shaped sub-pixels 1112 is less than a display area of the regular-shaped sub-pixels 1111.

Specifically, the fan-out regions include a first fan-out region 121 arranged along a first direction D1 and a second fan-out region 122 arranged along a second direction D2. The plurality of slits 13 include a first slit 131 arranged along the first direction D1 and a second slit 132 arranged along the second direction D2. The first direction D1 is perpendicular to the second direction D2.

Particularly, data signal lines 1211 are disposed in the first fan-out region 121, and scanning signal lines 1221 are disposed in the second fan-out region 122.

In the LED splicing display panel provided by the first embodiment of the present disclosure, the sub-pixels 111 abutting the plurality of fan-out regions 12 are the irregular-shaped sub-pixels 1112. Furthermore, the irregular-shaped sub-pixels 1112 include first irregular-shaped sub-pixels 11121 and second irregular-shaped sub-pixels 11122. The first irregular-shaped sub-pixels 11121 respectively abut to the first fan-out region 121 and the second fan-out region 122. The second irregular-shaped sub-pixels 11122 abut to the first fan-out region 121 or the second fan-out region 122.

Particularly, a display area of the first irregular-shaped sub-pixels 11121 is less than a display area of the second irregular-shaped sub-pixels 11122.

Furthermore, the data signal lines 1211 are arranged on a same side of the first slit 131, and the scanning signal lines 1221 are arranged on a same side of the second slit 132.

Specifically, each of the sub-LED display panels further includes a base substrate, a thin film transistor layer disposed on the base substrate, and an LED light emitting layer disposed on the thin film transistor layer. The LED light emitting layer is located on the display regions 11. The LED light emitting layer includes a plurality of LED chips distributed in an array manner. The plurality of LED chips are electrically connected to the thin film transistor layer.

In the LED splicing display panel provided by the first embodiment of the present disclosure, disposing the plurality of irregular-shaped sub-pixels 1112 and abutting them to the corresponding fan-out regions 12 on the edges of the four display regions 11 in the repeat unit 10 effectively ease spatial limitation of part of pixels in key positions, and are further conducive to development of the LED splicing screens toward the direction of small dimensions and high resolution.

Figure 2:
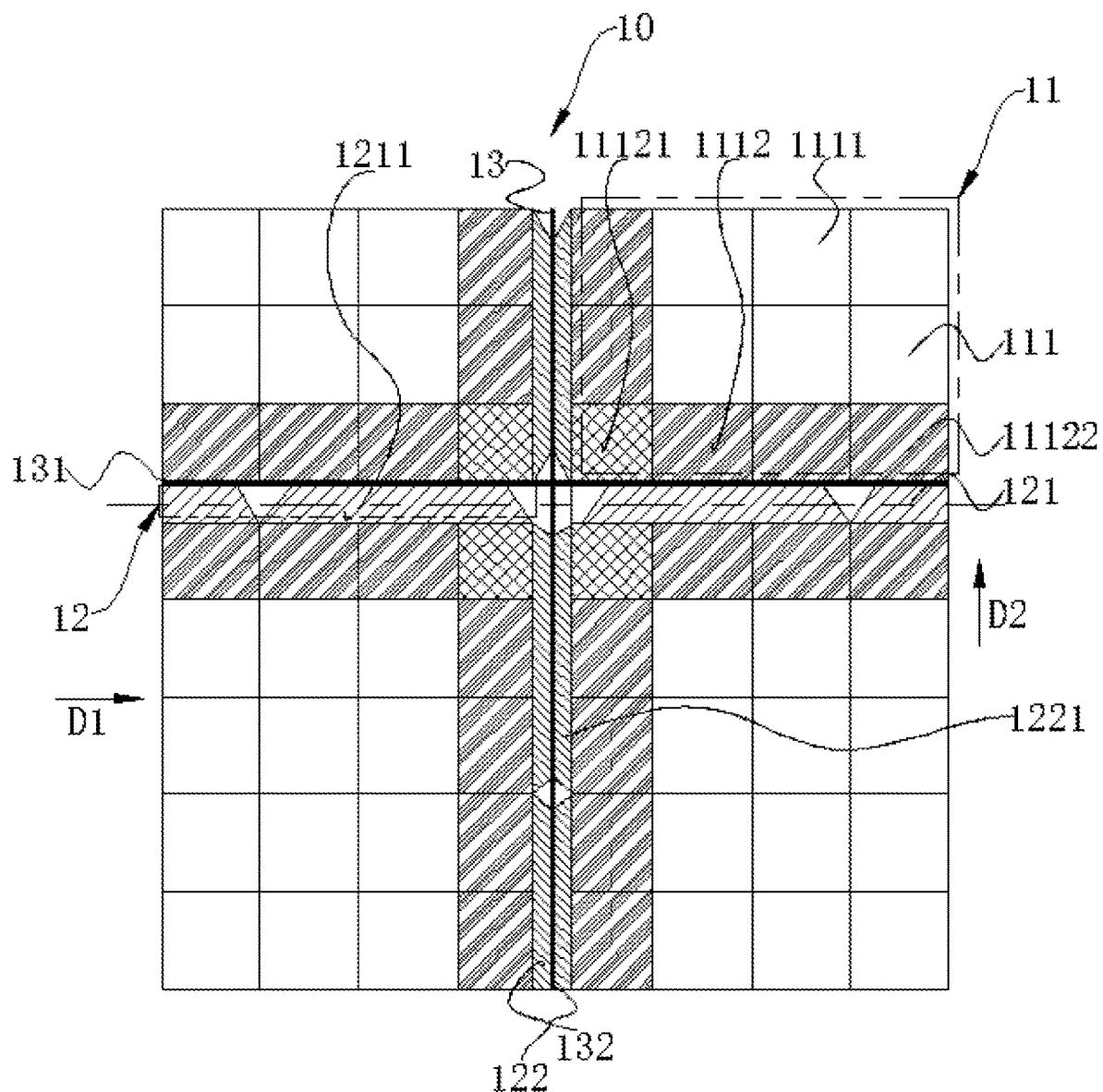
FIG. 2 is a structural schematic diagram of the repeat units of the LED splicing display panel provided by a second embodiment of the present disclosure.

Illustrated in FIG. 2 is a structural schematic diagram of the repeat units of an LED splicing display panel provided by a second embodiment of the present disclosure. Furthermore, the LED splicing display panel includes at least one repeat unit 10. Each of the repeat unit 10 includes four sub-LED display panels spliced to each other. Display regions 11 of the four sub-LED display panels are arranged in two rows and two columns. Each of the sub-LED display panels includes the display region 11 and fan-out regions 12 respectively corresponding to two adjacent sides of the plurality of display regions 11. Slits 13 are between two adjacent sub-LED display panels. The two adjacent sub-LED display panels share the fan-out regions 12.

Specifically, sub-pixels 111 are in the four display regions 11. The sub-pixels 111 include irregular-shaped sub-pixels 1112 located on edges of the four display regions 11, and regular-shaped sub-pixels 1111 respectively adjacent to the irregular-shaped sub-pixels 1112. Each of the irregular-shaped sub-pixels 1112 abuts to the corresponding fan-out region 12.

Specifically, a display area of the irregular-shaped sub-pixels 1112 is less than a display area of the regular-shaped sub-pixels 1111.

Specifically, the fan-out regions include a first fan-out region 121 arranged along a first direction D1 and a second fan-out region 122 arranged along a second direction D2. The plurality of slits 13 include a first slit 131 arranged along the first direction D1 and a second slit 132 arranged along the second direction D2. The first direction D1 is perpendicular to the second direction D2.

Particularly, data signal lines 1211 are disposed in the first fan-out region 121, and scanning signal lines 1221 are disposed in the second fan-out region 122.

In the LED splicing display panel provided by the second embodiment of the present disclosure, the sub-pixels 111 abutting the plurality of fan-out regions 12 are the irregular-shaped sub-pixels 1112. Furthermore, the irregular-shaped sub-pixels 1112 include first irregular-shaped sub-pixels 11121 and second irregular-shaped sub-pixels 11122. The first irregular-shaped sub-pixels 11121 respectively abut to the first fan-out region 121 and the second fan-out region 122. The second irregular-shaped sub-pixels 11122 abut to the first fan-out region 121 or the second fan-out region 122.

Particularly, a display area of the first irregular-shaped sub-pixels 11121 is less than a display area of the second irregular-shaped sub-pixels 11122.

Furthermore, the data signal lines 1211 are arranged on a same side of the first slit 131, and the scanning signal lines 1221 are evenly arranged on two adjacent sides of the second slit 132.

Specifically, each of the sub-LED display panels further includes a base substrate, a thin film transistor layer disposed on the base substrate, and an LED light emitting layer disposed on the thin film transistor layer. The LED light emitting layer is located on the display regions 11. The LED light emitting layer includes a plurality of LED chips distributed in an array manner. The plurality of LED chips are electrically connected to the thin film transistor layer.

In the LED splicing display panel provided by the second embodiment of the present disclosure, on one hand, the plurality of irregular-shaped sub-pixels 1112 are disposed on the edges of the four display regions 11 in the repeat unit 10 and are abutted to the corresponding fan-out regions 12, and on the other hand, the scanning signal lines 1221 are changed into double-sided drive, thereby dividing spatial pressure of the scanning signal lines on one side to two sides. Compared to the first embodiment of the present disclosure, the display area of the first irregular-shaped sub-pixel 11121 is further increased, and spatial requirement of pixel design is further satisfied, which are conducive to realizing development of the LED splicing screens toward the direction of small dimensions and high resolution.

Figure 3:
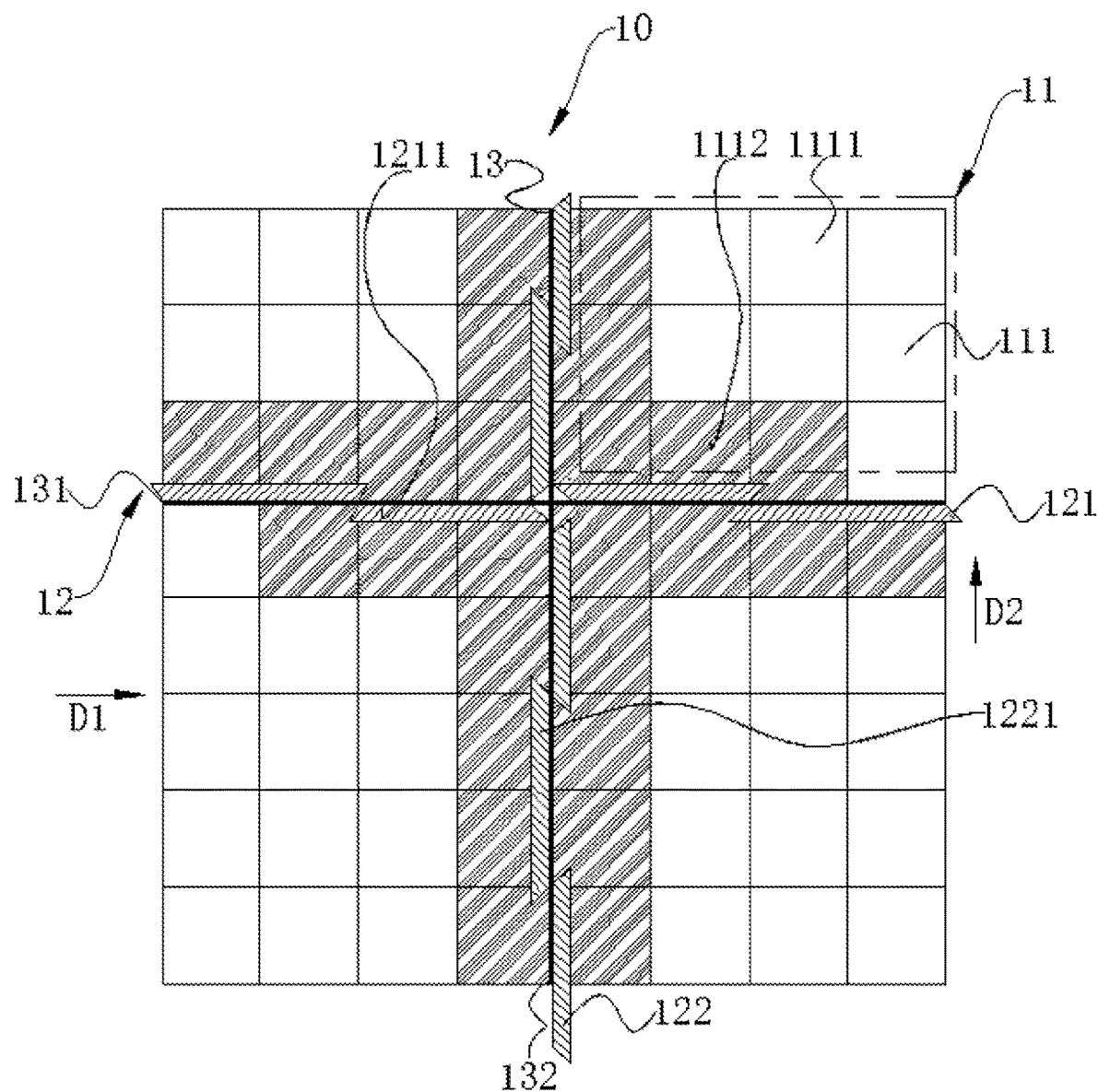
FIG. 3 is a structural schematic diagram of the repeat units of the LED splicing display panel provided by a third embodiment of the present disclosure.

Illustrated in FIG. 3 is a structural schematic diagram of repeat units of the LED splicing display panel provided by a third embodiment of the present disclosure. Furthermore, the LED splicing display panel includes at least one repeat unit 10. Each of the repeat unit 10 includes four sub-LED display panels spliced to each other. Display regions 11 of the four sub-LED display panels are arranged in two rows and two columns. Each of the sub-LED display panels includes the display region 11 and fan-out regions 12 respectively corresponding to two adjacent sides of the plurality of display regions 11. Slits 13 are between two adjacent sub-LED display panels. The two adjacent sub-LED display panels share the fan-out regions 12.

Specifically, sub-pixels 111 are in the four display regions 11. The sub-pixels 111 include irregular-shaped sub-pixels 1112 located on edges of the four display regions 11, and regular-shaped sub-pixels 1111 respectively being adjacent to the irregular-shaped sub-pixels 1112. Each of the irregular-shaped sub-pixels 1112 abuts to the corresponding fan-out region 12.

Specifically, a display area of the irregular-shaped sub-pixels 1112 is less than a display area of the regular-shaped sub-pixels 1111.

Specifically, the fan-out regions include a first fan-out region 121 arranged along a first direction D1 and a second fan-out region 122 arranged along a second direction D2. The plurality of slits 13 include a first slit 131 arranged along the first direction D1 and a second slit 132 arranged along the second direction D2. The first direction D1 is perpendicular to the second direction D2.

Particularly, data signal lines 1211 are disposed in the first fan-out region 121, and scanning signal lines 1221 are disposed in the second fan-out region 122.

In the LED splicing display panel provided by the third embodiment of the present disclosure, the sub-pixels 111 abutting the plurality of fan-out regions 12 are the irregular-shaped sub-pixels 1112. Furthermore, the irregular-shaped sub-pixels 1112 abut the first fan-out region 121 or the second fan-out region 122.

Furthermore, the data signal lines 1211 are arranged on two adjacent sides of the first slit 131 in a staggered manner, and the scanning signal lines 1221 are arranged on two adjacent sides of the second slit 132 in a staggered manner.

Specifically, each of the sub-LED display panels further includes a base substrate, a thin film transistor layer disposed on the base substrate, and an LED light emitting layer disposed on the thin film transistor layer. The LED light emitting layer is located on the display regions 11. The LED light emitting layer includes a plurality of LED chips distributed in an array manner. The plurality of LED chips are electrically connected to the thin film transistor layer.

In the LED splicing display panel provided the third embodiment of the present disclosure, on one hand, the plurality of irregular-shaped sub-pixels 1112 are disposed on the edges of the four display regions 11 in the repeat unit 10 and are abutted to the corresponding fan-out regions 12. On the other hand, spatial pressure of the scanning signal lines 1221 and the data signal lines 1211 are divided to two sides, and distribution positions of wirings are staggered. Compared these to the second embodiment of the present disclosure, the display area of the irregular-shaped sub-pixels 1112 in key positions are further increased, and spatial requirement of pixel design is satisfied, which are conducive to realizing development of the LED splicing screens toward the direction of small dimensions and high resolution.

For the specific implementation of each operation, please refer to the embodiments mentioned above, and unnecessary details will not be repeated hereinafter.

In summary, the LED splicing display panel provided by the embodiments of the present disclosure effectively eases spatial limitation of part of pixels in key positions by disposing the irregular-shaped sub-pixels and abutting them to the corresponding fan-out regions on the edges of the four display regions in one repeat unit, which is further conducive to development of the LED splicing screens toward the direction of small dimensions and high resolution.

It can be understood that for those of ordinary skill in the art, various other corresponding changes and modifications can be made according to the technical solutions and technical ideas of the present disclosure, and all such changes and modifications are intended to fall within the scope of protection of the claims of the present disclosure.

What is claimed is:

1. A light emitting diode (LED) splicing display panel, comprising at least one repeat unit, wherein each of the repeat unit comprises four sub-LED display panels spliced to each other, a plurality of display regions of the four sub-LED display panels are arranged in two rows and two columns, each of the sub-LED display panels comprises a corresponding display region of the plurality of display regions and a plurality of fan-out regions disposed at two adjacent sides of the corresponding display region, a plurality of slits are between two adjacent sub-LED display panels, and the two adjacent sub-LED display panels share the plurality of fan-out regions;

wherein a plurality of sub-pixels are in the plurality of display regions, the plurality of sub-pixels comprise a plurality of irregular-shaped sub-pixels located on edges of the plurality of display regions, and a plurality of regular-shaped sub-pixels respectively adjacent to the plurality of irregular-shaped sub-pixels, each of the plurality of irregular-shaped sub-pixels abuts to a corresponding fan-out region, and a display area of each of the plurality of irregular-shaped sub-pixels is less than a display area of each of the regular-shaped sub-pixels.

2. The LED splicing display panel as claimed in claim 1, wherein the plurality of fan-out regions comprise a first fan-out region arranged along a first direction D1 and a second fan-out region arranged along a second direction, the plurality of slits comprise a first slit arranged along the first direction and a second slit arranged along the second direction, and the first direction is perpendicular to the second direction.

3. The LED splicing display panel as claimed in claim 2, wherein a plurality of data signal lines are disposed in the first fan-out region, and a plurality of scanning signal lines are disposed in the second fan-out region.

4. The LED splicing display panel as claimed in claim 2, wherein the plurality of sub-pixels abutting the plurality of fan-out regions are the plurality of irregular-shaped sub-pixels.

5. The LED splicing display panel as claimed in claim 4, wherein a plurality of data signal lines are arranged on a same side of the first slit, and a plurality of scanning signal lines are arranged on a same side of the second slit.

6. The LED splicing display panel as claimed in claim 4, wherein a plurality of data signal lines are arranged on a same side of the first slit, and a plurality of scanning signal lines are arranged on adjacent two sides of the second slit.

7. The LED splicing display panel as claimed in claim 5, wherein the plurality of irregular-shaped sub-pixels comprise a plurality of first irregular-shaped sub-pixels and a plurality of second irregular-shaped sub-pixels, the plurality of first irregular-shaped sub-pixels respectively abut to the first fan-out region and the second fan-out region, and the plurality of second irregular-shaped sub-pixels abut to the first fan-out region or the second fan-out region.

8. The LED splicing display panel as claimed in claim 6, wherein the plurality of irregular-shaped sub-pixels comprise a plurality of first irregular-shaped sub-pixels and a plurality of second irregular-shaped sub-pixels, the plurality of first irregular-shaped sub-pixels respectively abut to the first fan-out region and the second fan-out region, and the plurality of second irregular-shaped sub-pixels abut to the first fan-out region or the second fan-out region.

9. The LED splicing display panel as claimed in claim 2, wherein part of the plurality of sub-pixels abut to the plurality of fan-out regions are the plurality of irregular-shaped sub-pixels.

10. The LED splicing display panel as claimed in claim 9, wherein a plurality of data signal lines are arranged on two adjacent sides of the first slit in a staggered manner, and a plurality of scanning signal lines are arranged on two adjacent sides of the second slit in a staggered manner.

11. A light emitting diode (LED) splicing display panel, comprising at least one repeat unit, wherein each of the repeat unit comprises four sub-LED display panels spliced to each other, a plurality of display regions of the four sub-LED display panels are arranged in two rows and two columns, each of the sub-LED display panels comprises a corresponding display region of the plurality of display regions and a plurality of fan-out regions disposed at two adjacent sides of the corresponding display region, a plurality of slits are between two adjacent sub-LED display panels, and the two adjacent sub-LED display panels share the plurality of fan-out regions;

wherein a plurality of sub-pixels are in the plurality of display regions, the plurality of sub-pixels comprise a plurality of irregular-shaped sub-pixels located on edges of the plurality of display regions, and a plurality of regular-shaped sub-pixels respectively adjacent to the plurality of irregular-shaped sub-pixels, and each of the plurality of irregular-shaped sub-pixels abuts to the corresponding fan-out region.

12. The LED splicing display panel as claimed in claim 11, wherein the plurality of fan-out regions comprise a first fan-out region arranged along a first direction and a second fan-out region arranged along a second direction, the plurality of slits comprise a first slit arranged along the first direction and a second slit arranged along the second direction, and the first direction is perpendicular to the second direction.

13. The LED splicing display panel as claimed in claim 12, wherein a plurality of data signal lines are disposed in the first fan-out region, and a plurality of scanning signal lines are disposed in the second fan-out region.

14. The LED splicing display panel as claimed in claim 12, wherein the plurality of sub-pixels abutting the plurality of fan-out regions are the plurality of irregular-shaped sub-pixels.

15. The LED splicing display panel as claimed in claim 14, wherein a plurality of data signal lines are arranged on a same side of the first slit, and a plurality of scanning signal lines are arranged on a same side of the second slit.

16. The LED splicing display panel as claimed in claim 14, wherein a plurality of data signal lines are arranged on a same side of the first slit, and a plurality of scanning signal lines are arranged on adjacent two sides of the second slit.

17. The LED splicing display panel as claimed in claim 15, wherein the plurality of irregular-shaped sub-pixels comprise a plurality of first irregular-shaped sub-pixels and a plurality of second irregular-shaped sub-pixels, the plurality of first irregular-shaped sub-pixels respectively abut to the first fan-out region and the second fan-out region, and the plurality of second irregular-shaped sub-pixels abut to the first fan-out region or the second fan-out region.

18. The LED splicing display panel as claimed in claim 16, wherein the plurality of irregular-shaped sub-pixels comprise a plurality of first irregular-shaped sub-pixels and a plurality of second irregular-shaped sub-pixels, the plurality of first irregular-shaped sub-pixels respectively abut to the first fan-out region and the second fan-out region, and the plurality of second irregular-shaped sub-pixels abut to the first fan-out region or the second fan-out region.

19. The LED splicing display panel as claimed in claim 12, wherein part of the plurality of sub-pixels abut to the plurality of fan-out regions are the plurality of irregular-shaped sub-pixels.

20. The LED splicing display panel as claimed in claim 19, wherein a plurality of data signal lines are arranged on two adjacent sides of the first slit in a staggered manner, and a plurality of scanning signal lines are arranged on two adjacent sides of the second slit in a staggered manner.

* * * * *